(12) United States Patent
Hou

(10) Patent No.: US 6,821,138 B2
(45) Date of Patent: Nov. 23, 2004

(54) ZIF SOCKET CONNECTOR HAVING MEANS FOR PREVENTING CPU MOUNTED ON THE CONNECTOR FROM DEFORMATION DUE TO A CLAMPING FORCE ACTING THEREON

(75) Inventor: Sung-Pei Hou, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/282,493

(22) Filed: Oct. 28, 2002

(65) Prior Publication Data

US 2004/0005800 A1 Jan. 8, 2004

(30) Foreign Application Priority Data

Jul. 4, 2002 (TW) ........................................ 91210184 U

(51) Int. Cl.⁷ ................................................ H01R 4/50
(52) U.S. Cl. ........................................ 439/342; 439/948
(58) Field of Search ................................ 439/342, 948

(56) References Cited

U.S. PATENT DOCUMENTS

| | | | |
|---|---|---|---|
| 4,538,870 A | * | 9/1985 | Thewlis ...................... 439/329 |
| 5,226,824 A | * | 7/1993 | Karlovich et al. ............ 439/70 |
| 5,249,971 A | * | 10/1993 | Lai et al. ....................... 439/70 |
| 5,489,218 A | | 2/1996 | McHugh |
| 5,679,020 A | | 10/1997 | Lai et al. |
| 5,722,848 A | | 3/1998 | Lai et al. |
| 6,371,786 B1 | | 4/2002 | Howell et al. |
| 6,383,006 B1 | | 5/2002 | McHugh et al. |

* cited by examiner

Primary Examiner—Phuong Dinh
(74) Attorney, Agent, or Firm—Wei Te Chung

(57) ABSTRACT

A socket connector (1) includes a base (10) defining an array of terminal cells (111), a number of conductive contacts (30) received in the respective terminal cells, a cover (20) slidably mounted on the base and a driving device (40) sandwiched between the cover and the base for driving the cover to move relative to the base. The cover has a supporting surface (211) for supporting a CPU (5) and defines an array of pin holes (213) corresponding to the terminal cells for insertion of pins (51) of the CPU therethrough. A standoff is formed on each of peripheral edges of the supporting surface, and a number of small-dimensioned supporting posts (222) and large-dimensioned supporting posts (223) are formed on the supporting surface within the outline positions of the standoffs for supporting the CPU mounted on the socket connector. The standoff and the supporting posts have the same height.

1 Claim, 6 Drawing Sheets

ZIF SOCKET CONNECTOR HAVING MEANS FOR PREVENTING CPU MOUNTED ON THE CONNECTOR FROM DEFORMATION DUE TO A CLAMPING FORCE ACTING THEREON

BACKGROUND OF THE INVENTION

1. Field of the Invention

The present invention is related to an electrical socket connector, and more particularly to a zero insertion force (ZIF) socket connector for connecting a central processing unit (CPU) to a printed circuit board.

2. Description of Related Art

ZIF socket connectors are popularly used in computer industry for electrically connecting CPUs with printed circuit boards (PCBs). U.S. Pat. Nos. 5,489,218, 5,679,020, 5,722,848, 6,371,786 and 6,383,006 all disclose conventional ZIF socket connectors. These ZIF socket connectors each comprise a base having a number of contact passageways retaining conductive terminals therein, a cover slidably engaging with the base and defining a corresponding plurality of pin holes for receiving contact pins of a CPU therein, and a driving device sandwiched between the cover and the base for driving the cover to move relative to the base. When the CPU is mounted on the cover, the pins thereof are received in the respective pin holes of the cover.

Following the increasing functions of the CPU, the number of the contact pins thereof increases accordingly. For advanced CPU such as Intel Northwood or AMD SledgeHammer, vibration of the CPU mounted on a socket connector due to an operation of a cooling fan becomes a problem. To solve this problem, a standoff is formed on periphery edges of a top face of the cover of the socket connector, so that top enlarged ends of the pins will not engage with the top face of the cover of the socket, as shown in FIG. 5 of the present application. FIG. 5, in a cross-sectional manner, shows a related ZIF socket connector 7 for electrically connecting a CPU 8 with a printed circuit board 92. The socket connector 7 has a cover 70 slidably mounted on a base 73 thereof. A standoff 72 is formed on periphery edges of a top face of the cover 70. A plurality of contacts 74 is received in the base 73. The CPU 8 is mounted on the top face of the cover 70 and supported by the standoff 72. The CPU 8 has pins 81 extending downwardly through pin holes 71 defined in the cover 70 into the base 73 to electrically connect with the contacts 74. Each pin 81 has an enlarged top end 811 received in a recess 75 in the top face within the standoff 72. A heat sink 9 is mounted on the CPU 8. A cooling fan (not shown) is mounted on the heat sink 9. A clamping force F is applied to the heat sink 9 to cause it to have an intimate engagement with the CPU 8 so heat generated by the CPU 8 can be effectively dissipated by the heat sink 9. Although the socket connector 7 can resolve the problem of vibration of the CPU 8 due to an operation of the cooling fan, since there lacks any support other than the standoff 72, the clamping force F causes the CPU to have an excessive deflection about its central portion, which may result in damage of the CPU 8.

Hence, it is requisite to provide an improved electrical socket connector to overcome the above-mentioned disadvantages of the prior art.

SUMMARY OF THE INVENTION

Accordingly, an object of the present invention is to provide a ZIF socket connector which can overcome the problem of vibration of CPU mounted on the socket connector due to an operation of a cooling fan and at the same time provides support to the CPU to prevent it from excessive deformation due to a clamping force for firmly fastening a heat sink to the CPU.

In order to achieve the object set forth, a ZIF socket connector in accordance with the present invention is used for electrically connecting a CPU with a circuit board. The socket connector comprises a base defining an array of terminal cells, a plurality of conductive contacts received in the respective terminal cells, a cover slidably mounted on the base and a driving device sandwiched between the cover and the base for driving the cover to move relative to the base. The cover defines an array of pin holes corresponding to the terminal cells and communicating therewith for insertion of pins of the CPU therethrough, and has a supporting surface for supporting the CPU. A standoff is formed on each of peripheral edges of the supporting surface and a plurality of supporting posts is formed on the supporting surface within the outline positions of the standoffs for supporting the CPU mounted on the socket connector in accordance with the present invention. The standoff and the supporting posts have the same height.

Other objects, advantages and novel features of the invention will become more apparent from the following detailed description of the present embodiment when taken in conjunction with the accompanying drawings.

DETAILED DESCRIPTION OF THE INVENTION

Reference will now be made in detail to the preferred embodiment of the present invention.

Figure 1:
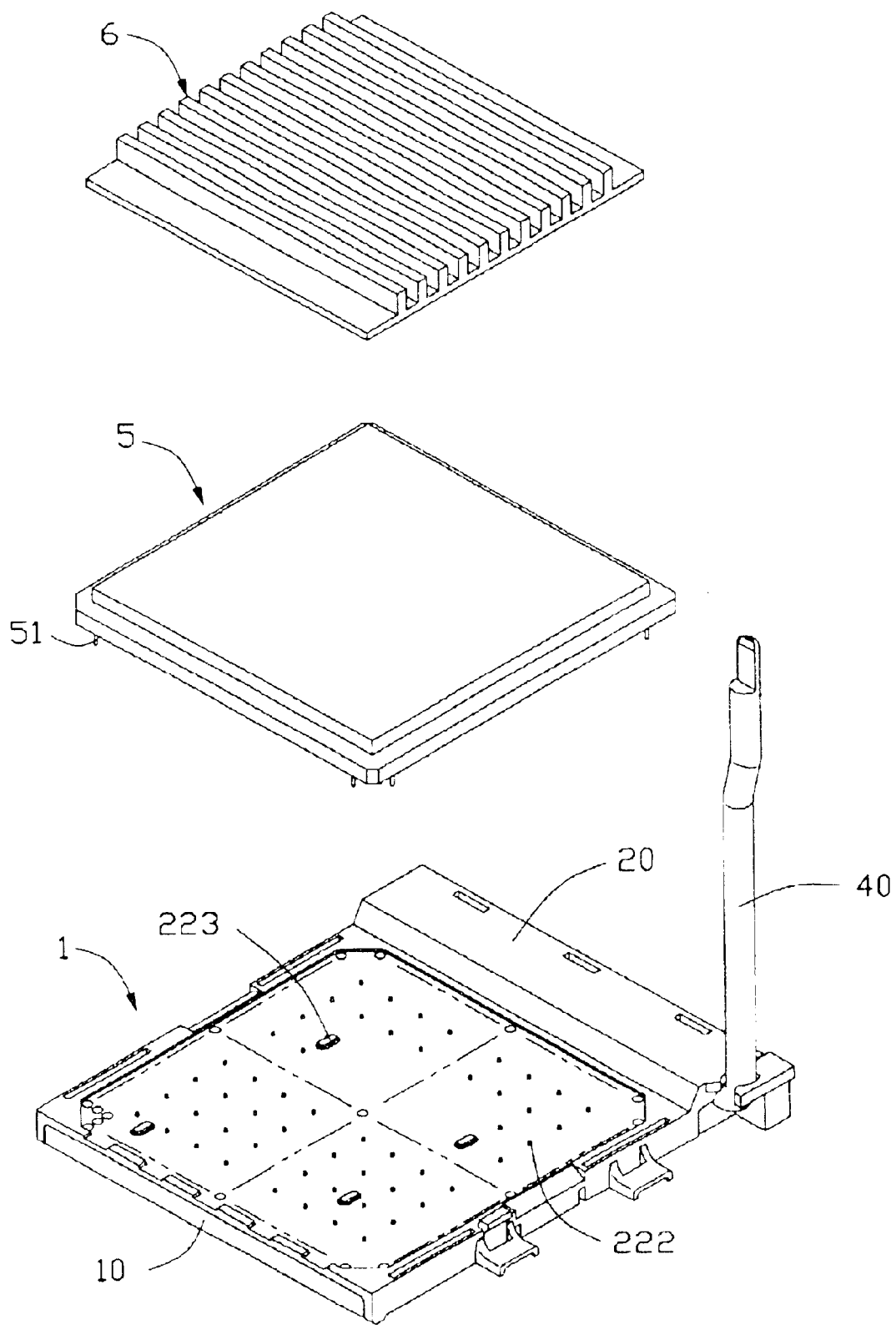
FIG. 1 is a perspective view of a ZIF socket connector in accordance with the present invention, a CPU and a heat sink.
Figure 2:
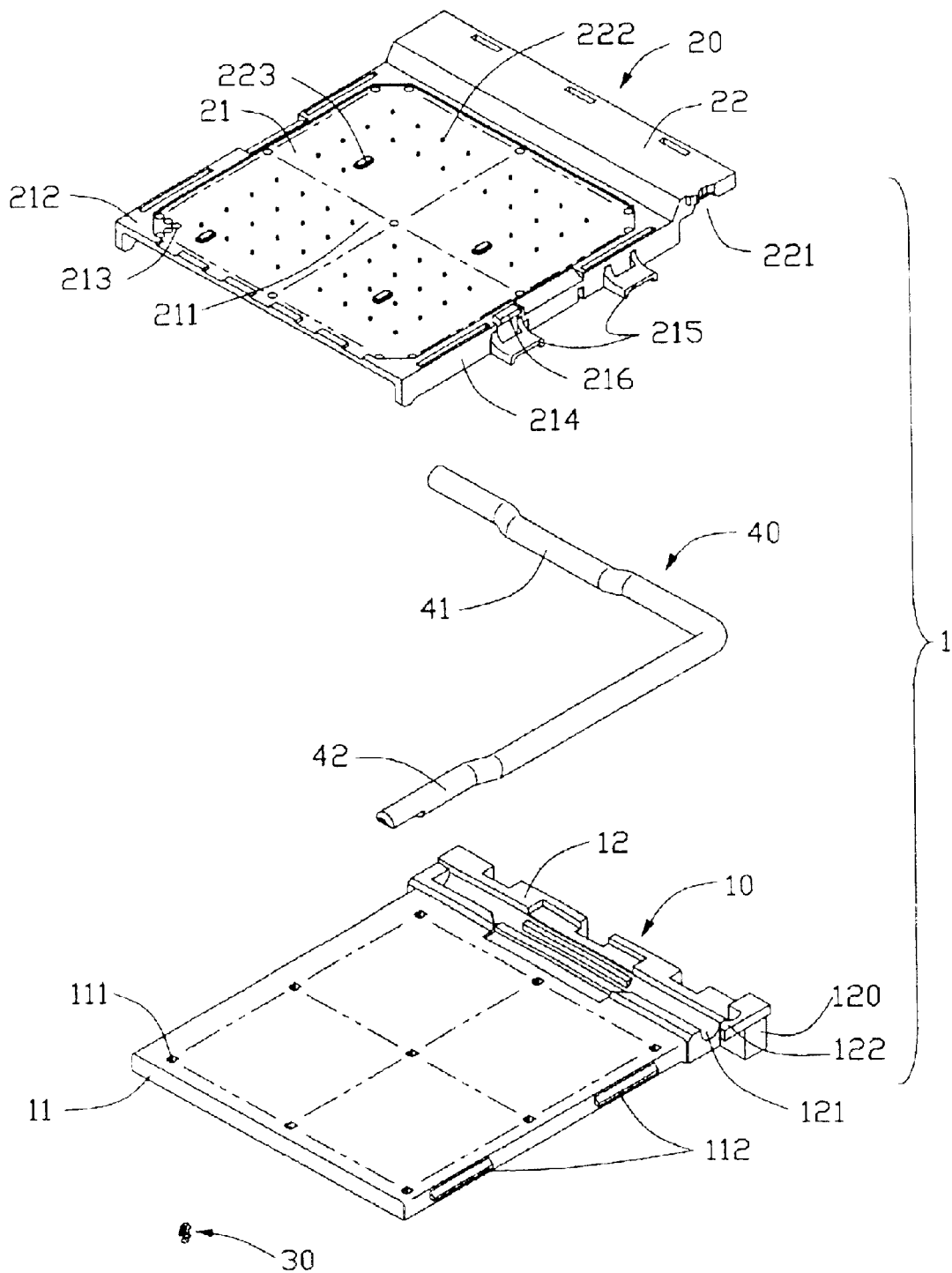
FIG. 2 is an exploded, perspective view of the ZIF socket connector of FIG. 1.

Referring to FIG. 1 and 2, a ZIF socket connector 1 for electrically connecting a CPU 5 to a printed circuit board (not shown) in accordance with the present invention comprises a base 10 for being securely mounted onto the printed circuit board, a cover 20 movably mounted on the base 10, a plurality of conductive contacts 30 (only one shown) retained in the base 10 and an driving device 40 embedded between the base 10 and the cover 20 for driving the cover 20 to move relative to the base 10.

Referring to FIG. 2, the base 10 includes a dielectric rectangular body 11 and a platform 12 extending from one side of the body 11. The body 11 defines an array of terminal cells 111 for receiving a corresponding number of the conductive contacts 30. The body 11 further has a plurality of engaging bars 112 on two side walls thereof. The platform 12 defines a lower half channel 121 in an upper surface thereof along a traverse direction. One end of the lower half channel 121 is an opening through a end wall of the platform 12, and the other end thereof is closed. Additionally, the platform 12 includes a retention means 120 integrally formed near the one end where the lower half channel 121 is opened. A hook 122 extends forwardly from a top portion of the retention means 120 to a position corresponding to the lower half channel 121.

The cover 20 slidably assembled onto the base 10 comprises a dielectric rectangular body 21 and a protrusion 22 extending from one side of the body 21. An upper surface of the body 21 is a supporting surface 211 for supporting the CPU 5. The cover 20 defines an array of pin holes 213 corresponding to the terminal cells 12 of the base 10 and communicating therewith for insertion of pins 51 of the CPU 5 therethrough. The supporting surface 211 provides a standoff 212 on periphery edges thereof. The standoff 212 extends upwardly from the supporting surface 211. Two side walls 214 vertically downwardly extend from opposite lateral sides of the body 21 of the cover 20. Each side wall 214 has a groove (not shown) in an inner face thereof for engaging with a corresponding engaging bar 112 of the body 11 of the base 10 for slidably fastening the base 10 and the cover 20 together. One of the side walls 214 outwardly extends a pair of supporting portions 215 at a bottom thereof and has a tab 216 at a top thereof. The protrusion 22 defines an upper half channel 221 in a bottom thereof corresponding to the lower half channel 121 of the platform 12 of the base 10. The upper half channels 221 joins with the lower half channel 121 to form a full channel (not labeled).

The driving device 40 has a cam shaft 41 received in the full channel and an operating handle 42 perpendicularly extending from an end of the cam shaft 41. When the cover 20, the base 10 and the driving device 40 are assembled together, the operating handle 42 is located at the side of the socket connector 1 at which the supporting portions 215 are formed. The cam shaft 41 has a middle section offset from a rotating axis thereof. When rotating the operating handle 42, the cam shaft 41 is rotated to drive the cover 20 to move relative to the base 10. When the operating handle 42 is in a vertical position with regard to the base 10, the operating handle 42 engages with the hook 122 of the retention means 120 of the base 10; when the operating handle 42 is in a horizontal position with regard to the base 10, the operating handle 42 is supported by the supporting portion 215 of the cover 20 and locked by the tab 216 thereof, whereby the base 10 and the cover 20 is reliably positioned at an open position or a closed position.

Figure 3:
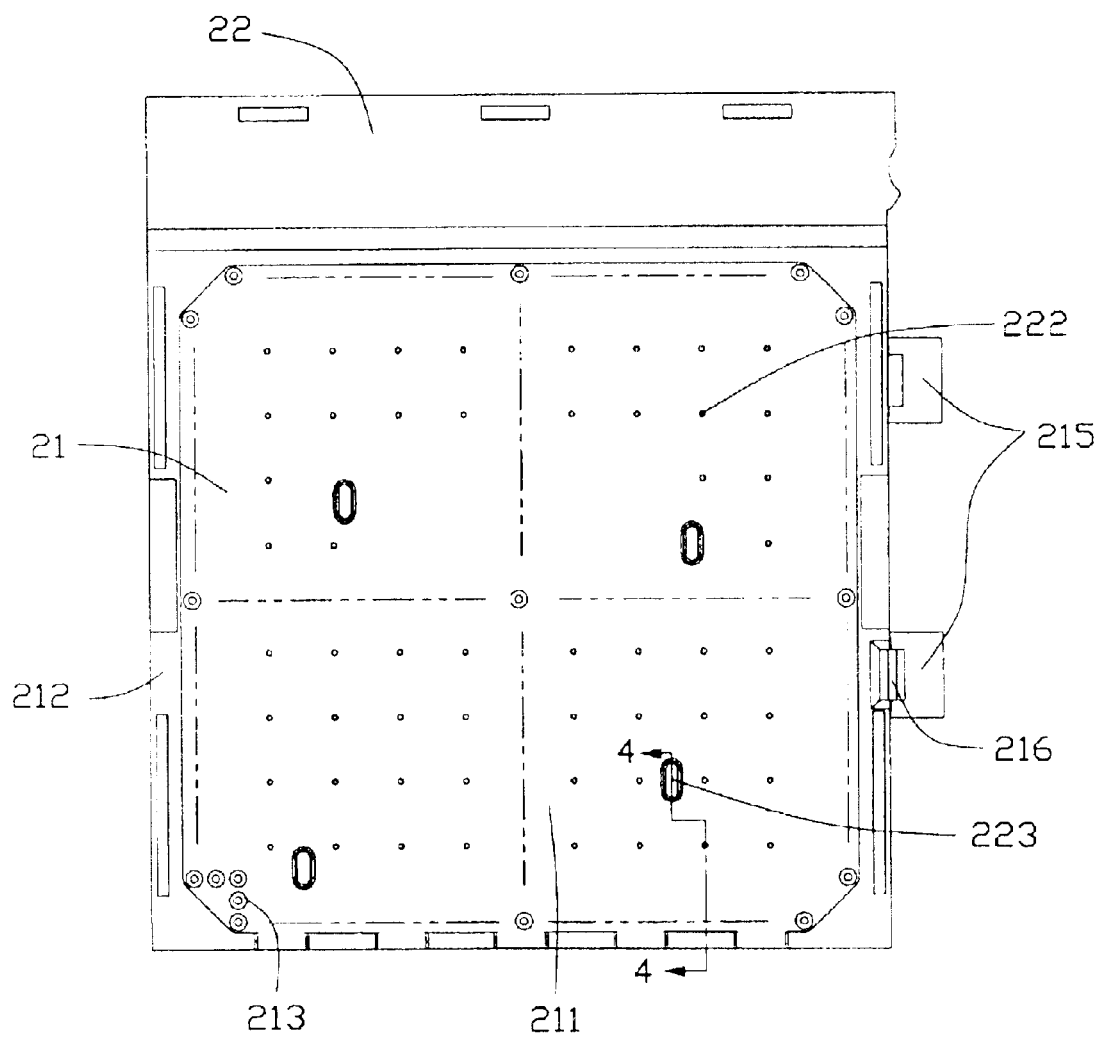
FIG. 3 is a top view of a cover of the socket connector of FIG. 2.
Figure 4:
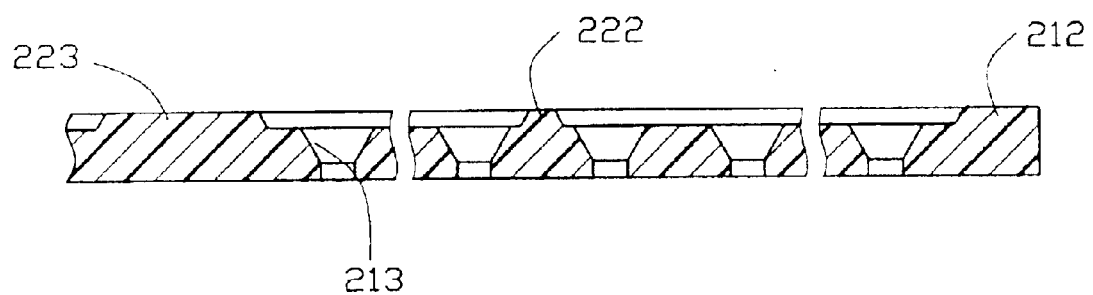
FIG. 4 is a cross-sectional view taken along line 4—4 of FIG. 3.
Figure 4A:
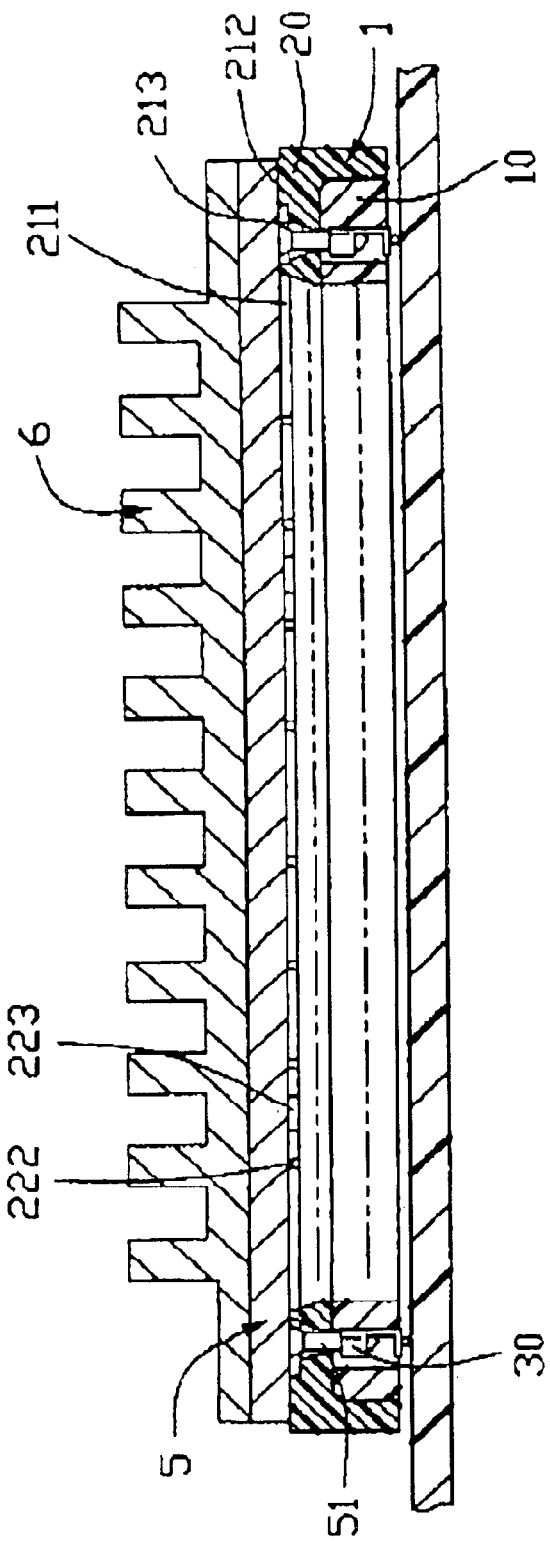
FIG 4A is an assembled, cross-sectional view of the socket connector, the CPU and the heat sink.
Figure 5:
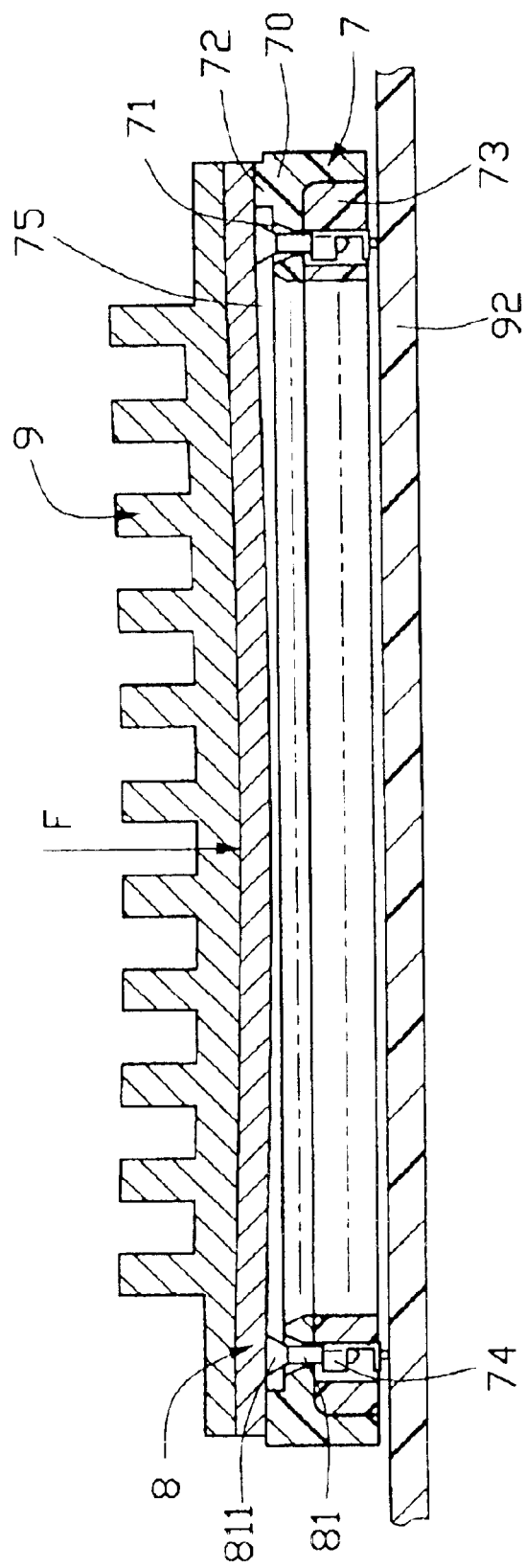
FIG. 5 is an assembled, cross-sectional view of a conventional socket connector, a CPU and a heat sink.

Referring to FIG. 3, in the pin holes area, a plurality of small-dimensioned, tapered supporting posts 222 arranged generally in a manner of a matrix among the holes 213 extends upwardly from the supporting surface 211. Furthermore, four large-dimensioned, tapered supporting posts 223 located among the small supporting posts 222 and the holes 213 extend from the supporting surface 211. As shown in FIG. 4, the small-dimensioned supporting posts 222 has the same height as the large-dimensioned supporting posts 223 and the standoff 212. When the CPU 5 is mounted on the supporting surface 211, periphery edges of a bottom thereof are supported by the standoff 212 of the cover 20. An area of the bottom of the CPU 5 other than the periphery edges thereof is supported by the supporting posts 222, 223. By such design, a clamping force acting on a heat sink 6 and the CPU 5 for fastening the heat sink 6 to the CPU 5 can be effectively resisted by the standoff 212 and the supporting posts 222, 223. Thus, an excessive deformation of the CPU 5 due to the clamping force can be avoided. Furthermore, by such design, problem of vibration of the CPU 5 due to an operation of a cooling fan (not shown) mounted on the heat sink 6 for cooling the CPU 5 can be improved.

It should be noted that, the supporting posts can also all be the small-dimensioned supporting posts 222 or can all be the large-dimensioned supporting posts 223, and configuration of the supporting posts can also be cylindrical or other similar shape. These modifications can achieve the same effect as the preferred embodiment described above.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector for electrically interconnecting a central processing unit (CPU) with a circuit board, comprising:

a base defining an array of terminal cells;

a plurality of conductive contacts received in the respective terminal cells; and a cover slidably mounted on the base defining an array of pin holes corresponding to the terminal cells and communicating therewith for insertion of pins of the CPU therethrough, the cover having a supporting surface for supporting the CPU, a standoff formed on each of peripheral edges of the supporting surface and a plurality of supporting posts formed on the supporting surface within the outline positions of the standoffs, the supporting posts arranged generally in a manner of a matrix among the pin holes, the supporting posts and the standoff having the same height from the supporting surface; wherein said supporting posts comprise a plurality of small-dimensioned supporting posts with a tapered configuration arranged generally in a manner of a matrix in the pin holes area; wherein said supporting posts further comprise a plurality of large-dimensioned supporting posts with a tapered configuration, the large-dimensioned supporting post being fewer than the small-dimensioned supporting posts.

* * * * *